United States Patent
Shima et al.

(10) Patent No.: US 6,738,128 B2
(45) Date of Patent: May 18, 2004

(54) EXPOSURE APPARATUS

(75) Inventors: Shinichi Shima, Utsunomiya (JP); Kohei Maeda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/402,978

(22) Filed: Apr. 1, 2003

(65) Prior Publication Data
US 2003/0184719 A1 Oct. 2, 2003

(30) Foreign Application Priority Data
Apr. 2, 2002 (JP) ........................ 2002-100581

(51) Int. Cl.[7] .................... G03B 27/68; G03B 27/62
(52) U.S. Cl. ............................. 355/52; 355/75
(58) Field of Search ..................... 355/53, 52, 55, 355/75, 77; 250/492.1, 492.2

(56) References Cited

U.S. PATENT DOCUMENTS

| 4,624,551 A | 11/1986 | Anzai et al. ............ 355/53 |
| 4,801,977 A | 1/1989 | Ishizaka et al. ......... 355/30 |
| 6,262,792 B1 * | 7/2001 | Higashiki ............... 355/52 |
| 6,268,903 B1 * | 7/2001 | Chiba et al. ........... 355/53 |
| 6,549,271 B2 * | 4/2003 | Yasuda et al. .......... 355/55 |
| 2003/0016338 A1 | 1/2003 | Yasuda et al. .......... 355/55 |

FOREIGN PATENT DOCUMENTS

| EP | 1 024 522 A1 | 7/1998 |
| JP | 60-78455 | 5/1985 |
| JP | 63-58349 | 3/1988 |
| JP | 4-192317 | 7/1992 |
| JP | 8-203805 | 8/1996 |
| JP | 10-214780 | 8/1998 |
| JP | 11-31652 | 2/1999 |
| JP | 11-45842 | 2/1999 |

* cited by examiner

*Primary Examiner*—Russell Adams
*Assistant Examiner*—D. Ben Esplin
(74) *Attorney, Agent, or Firm*—Fitzpatrick, Cella, Harper & Scinto

(57) ABSTRACT

An exposure apparatus includes a projection optical system for projecting a pattern formed a mask onto an object to be exposed, a correction optical element, provided between the mask and the projection optical system, for reducing a deformation of the pattern, and a detector of an oblique light projection system, provided at a side of a pattern surface of the mask, for detecting a surface shape of the mask through the correction optical element.

12 Claims, 8 Drawing Sheets

EXPOSURE APPARATUS

This application claims the right of priority under 35 U.S.C. §119 based on Japanese Patent Application No. 2002-100581, filed on Apr. 2, 2002, which is hereby incorporated by reference herein in its entirety as if fully set forth herein.

BACKGROUND OF THE INVENTION

The present invention relates to exposure apparatuses used to expose a pattern on a reticle or mask (these terms are used interchangeably in this application) onto a plate, such as a wafer and a glass plate in a manufacture process of semiconductor devices, liquid crystal display devices etc. The present invention is suitable, for example, for a scan-type exposure apparatus.

The fabrication of a device, such as a semiconductor device, an LCD device, and a thin film magnetic head using the lithography process has conventionally employed a projection exposure apparatus to transfer a circuit pattern formed on a photo-mask or reticle onto a photosensitive wafer substrate and glass plate ("wafer" hereinafter). Recent semiconductor devices etc. have been required for finer patterns. This demand requires higher resolution of the projection optical system. The higher resolution is available with a shorter wavelength of exposure light and a larger numerical aperture of the projection optical system.

A chip pattern size of one semiconductor device tends to become large, and an apparatus for exposing a larger area has been demanded.

These two requirements need a projection optical system with a large exposure area and high resolution. However, it becomes difficult to maintain imaging performance, such as distortion, within permissible accuracy for a larger exposure area and higher resolution throughout the exposure area.

A scan-type exposure apparatus has currently called attentions, which transfers a reticle pattern onto a wafer by scanning a slit-shaped, e.g., arc-shaped illumination area on the reticle and wafer synchronously.

This system illuminates a slit area on the reticle, and uses only part of the projection optical system. It thus has an advantage in easily maintaining the imaging performance, such as distortion, within predetermined accuracy.

An additional advantage is that the slit-shaped illumination on the reticle makes available the maximum diameter of the effective exposure area of the projection optical system, and the scan may enlarge an exposure area in the scan direction without affected by any restriction of the optical system.

However, a currently demanded further finer pattern requires the scan-type exposure apparatus to reduce distortion of a pattern image.

A reduction of distortion naturally leads to reductions of various aberrations in the projection optical system. Therefore, a projection optical system to be loaded on a conventional stepper is optically designed on condition that various aberrations and distortions are reduced averagely in the entire projection field. In order to maintain various aberrations and distortion within permissible ranges, the projection optical system is assembled by a method that repeats complex and arduous assemblies, adjustments and inspections, and the method includes the steps of processing a lens element and optical element with high precision, actually measuring various aberrations, and adjusting an air separation between two lenses, a lens's tilt and a parallel decentering.

In particular, the above adjustment method may adjust symmetrical components or asymmetrical but regular components of the distortion among various aberrations.

However, the above adjustment method cannot adjust so-called random components disadvantageously.

Accordingly, in order to mitigate difficulties of precise manufacture of the projection optical system and maintain the random component within a designed permissible range, Japanese Laid-Open Patent Application No. 8-203805, for example, discloses a method the steps of observing a distortion characteristic of an assembled projection optical system, and inserting a polished optical correction plate or correction optical element into a projection optical path so as to partially deflect a principal ray that passes each point in the projection field so that the observed distortion characteristic at each point in the projection field may be minimized. Japanese Laid-Open Patent Application No. 8-203805 is directed to a correction method for use with a stepper using an optical correction plate.

Japanese Laid-Open Patent Application No. 11-045842 discloses a correction method using an optical correction plate in a scan-type exposure apparatus. Japanese Laid-Open Patent Application No. 11-045842 addresses that the static distortion characteristic is averaged over a width in the projection area in a scan direction and turns to a dynamic distortion characteristic, when a mask pattern is exposed onto a photosensitive substrate using a scan type projection exposure apparatus, and corrects a random component in the dynamic distortion characteristic by arranging in a projection optical path a distortion correction plate that is made through a local polishing process of a surface of a transparent parallel plate or optical correction plate.

Japanese Laid-Open Patent Application No. 11-031652 is directed to manufactures and measurements of an optical correction plate. Japanese Laid-Open Patent Application No. 11-031652 provides an optical correction plate with a plate having a wedge angle, so as to prevent interference of backlight of the optical correction plate in measuring a surface shape of an optical correction plate using an interferometer.

While the above discusses the prior art about distortion, a fluctuation of the imaging performance of an image projected by the projection optical system should be also considered in addition to distortion to create a finer pattern. The finer pattern narrows a permissible fluctuation range of the imaging performance. In order to correct a fluctuation of the imaging performance, such as a magnification and focal position, as a result of that the projection optical system absorbs the illuminated light, as disclosed in Japanese Laid-Open Patent Applications Nos. 60-78455 and 63-58349, conventional projection exposure apparatuses have included an imaging-performance correction mechanism for detecting a quantity of light incident upon the projection optical system and for correcting the fluctuation of the imaging performance of the projection optical system according to the detected quantity of light.

For example, the mechanism disclosed in Japanese Laid-Open Patent Application No. 60-78455 previously prepares a model indicative of a fluctuation characteristic in the imaging performance in a projection optical system, calculates an energy amount of light incident upon the projection optical system at certain time intervals using a photoelectric sensor, etc. on a wafer stage mounted with a wafer, and calculates a fluctuation of the imaging performance by applying an integral value of the light energy amount to the model. This method calculates the exposure time to calculate the integral value of the light energy incident upon the projection optical system by always monitoring, for example, a signal indicative of an open state of a shutter for opening and closing illumination light, obtains the fluctuation of the imaging performance of the projection optical system according to this model, and provides a correction based on this fluctuation. This appears to solve problems associated with the fluctuation of the imaging performance due to the projection optical system that has absorbed illumination light.

However, the illumination light passes through the mask, and thermally deforms the mask that absorbs the illumination light, disadvantageously deteriorating the imaging performance. In particular, the mask forms a pattern using a light-shielding film, such as a chrome film, and the light-shielding film absorbs larger heat than a glass plate that has high transmittance. More particular, the recent technology often uses the light-shielding film with low reflectance on the mask to prevent flare in the optical system, and this trend further increases the thermal absorption on the light-shielding film.

A circuit pattern using a light-shielding film on the mask does not necessarily distribute evenly on the entire mask, rather often distributes unevenly. In this case, the temperature on the mask locally rises and possibly generates an anisotropic deformation. A similar anisotropic deformation may possibly occur in exposure that uses a variable field stop (or reticle blind) etc. to expose part of a pattern on a mask. The mask's deformation thus generated causes an anisotropic deformation in the projected image. In this case, a correction of only the magnification component is insufficient.

An even correction of the thermal deformation of the mask is difficult because a thermal deformation amount and a fluctuation of the imaging performance changes according to kinds of the mask used. For example, a fluctuation of the imaging performance due to the thermal deformation of a mask used to adjust the imaging performance at the time of shipping of the projection exposure apparatus may be corrected as if it is regarded as the fluctuating imaging performance of the projection exposure apparatus. However, an accurate correction is unavailable for other masks because these masks have different thermal deformation amounts. In particular, exposures by exchanging masks one by one would accumulate fluctuations of the imaging performance and cause a large error if a thermal deformation amount of each mask is not considered.

Japanese Laid-Open Patent Application No. 4-192317 discloses a projection exposure apparatus that corrects changing optical performance that results from the thermal deformation of a mask, while considering as parameters the thermal absorptance of chrome that forms a mask pattern, and an existence ratio of chrome in a pattern, etc. Japanese Laid-Open Patent Application No. 4-192317 proposes the correction method of the imaging performance for a full field method.

A scan exposure method scans an illuminated area on a mask, and increases considerations for the mask, such as a cooling effect of the mask associated with the mask scan, whereby the calculation of the thermal deformation amount of the mask becomes more complex than the full field method.

Regarding the scan exposure, Japanese Laid-Open Patent Application No. 10-214780 discloses a projection exposure apparatus that corrects changing optical performance caused by a thermally deforming mask. Japanese Laid-Open Patent Application No. 10-214780 detects a deformation of the mask using an oblique light projection optical system, and operates and corrects the deformation amount of the mask.

A brief description will now be given of a mechanism used for the scan exposure method disclosed in Japanese Laid-Open Patent Application No. 10-214780. An exposure beam in the scan exposure has a narrow width in the scan direction and a wide width in a direction orthogonal to the scan direction. This method addresses an irradiation range of the exposure beam, controls focusing or leveling for the deformation in the scan direction, corrects the deformation in the direction orthogonal to the scan direction, and projects a pattern practically satisfactorily. In correcting the changing optical characteristic, the piezoelectric element is driven at both ends of the mask, and the mask is deformed so as to cancel its undesired deformation. There are plural piezoelectric elements in a direction in which the mask is moved in scanning.

The deformation of the mask is detected at one point or at plural points, and the optimal deformation correction amount is operated using the averaging method or least squares method. A method for detecting deformation at plural points may provide a plurality of mask deformation detection systems or use a diffraction grating to obtain plural beams from one light source. A method has also been proposed for arranging detection points for detecting the mask's deformation at both sides of the irradiation area of the exposure light in the scan direction of the mask, for detecting the mask's deformation amount in front of the irradiation area of the exposure light in the scan direction of the mask, and for real-time correcting a projected image of the mask pattern according to deformation amounts of the mask in the illumination area.

Japanese Laid-Open Patent Application No. 11-045842 discloses use of a correction optical element as prior art that is directed to a correction of distortion, in particular, in a scan-type exposure apparatus. Japanese Laid-Open Patent Application No. 10-214780 discloses a correction method using deformation detection means to detect mask's distortion and deformation.

A method disclosed in Japanese Laid-Open Patent Application No. 11-045842 uses a correction optical element and may correct distortion that results from a deformation in the projection optical system or a deformation generated at the time of holding the mask, but cannot disadvantageously correct the changing optical performance generated due to the mask's thermal deformation etc. during exposure. It has an additional disadvantage in that when the mask is replaced, it cannot correct distortion resulting from the mask's surface shape.

The method disclosed in Japanese Laid-Open Patent Application No. 10-214780 may measure the mask's surface shape and handle factors that attribute to the mask, but cannot disadvantageously correct distortion caused by the projection optical system. Therefore, it is necessary to simultaneously employ both methods of Japanese Laid-Open Patent Applications Nos. 11-045842 and 10-214780.

As disclosed in Japanese Laid-Open Patent Application No. 10-214780, when the deformation detection means of an oblique light projection system is arranged at the rear surface of the mask or mask pattern surface side, and the correction optical element for correcting distortion is arranged between the mask and projection optical system, the mask, the deformation detection means, the correction optical element, and the projection optical system should be arranged in this order.

Preferably, the correction optical element is arranged closer to the mask. In order to arrange the correction optical element close to the mask and properly arrange the deformation detection means, the detection light of the deformation detection means should detect the mask pattern surface through the correction optical element.

The correction optical element is a plate optic with a certain thickness, and experiences a minute polishing process for correction of part of the surface shape. Therefore, the detection light irradiated from the illumination optical system in the detection means enters the correction optical element in an oblique direction, reflects on the mask pattern surface, re-enters the correction optical element in an oblique direction, and reaches a detection part through a light-receiving element in the detection means. The aberration occurs at this time. A description will be given of the generation principle with reference to FIG. 3. FIG. 3A is a section of the reticle surface position detection system in a measurement direction. A pattern image for measurement that has been illuminated by an illumination optical system (not shown) is projected on a pattern surface on a reticle R through a light-projecting optical system and a correction optical element G1, and a reflected pattern image is imaged again on a light-receiving element 44 through a correction optical element G1 and light-receiving optical system. As shown in FIG. 3A, a correction optical element G1 as a parallel plate is inserted while inclined in condensed light in an observation optical system of an oblique light projection system.

FIG. 3B shows a section in a non-measurement direction. As shown in FIG. 3B, when the section in the non-measurement direction is addressed, the correction optical element G1 is arranged in the optical path of the light-projecting and light-receiving optical systems, perpendicular to the optical axis.

This enlarges a refractive angle of light having an angle of aperture between the measurement and non-measurement sections, and generates astigmatism that causes a positional offset between imaging points in the measurement and non-measurement directions. In particular, a detection optical system that combines the light-projecting and light-receiving optical systems with each other doubles the astigmatism on the light-receiving and re-imaging surface.

Since this method detects surface positions and conditions by projecting a slit-shaped mark as a measurement mark onto a pattern surface on the reticle R and detecting a positional offset of the mark using the light-receiving element 44, the astigmatism generated at the image-surface side decreases the resolution of the observing light-receiving element and disadvantageously deteriorates a measurement precision.

The correction optical element in the prior art is dimensioned so as to maintain an area through which the illumination light that has exposed the mask transmits. Therefore, the detection means of an oblique projection system detects a mask pattern surface through the correction optical element, and an area to detect the mask pattern surface through the correction optical element disadvantageously decreases by the oblique angle.

While FIG. 3 discusses the astigmatism, there is another problem in that a chromatic aberration occurs and lowers the detection precision as a result of an insertion of the correction optical element as a parallel plate in the convergence light.

Dispersion and thus chromatic aberration occur due to different refractive indexes among wavelengths of light used as detection light.

BRIEF SUMMARY OF THE INVENTION

Accordingly, it is an exemplified object of the present invention to provide an exposure apparatus for projecting a mask pattern properly by detecting a mask's deformation precisely while preventing the apparatus from being larger.

An exposure apparatus of one aspect of the present invention includes a projection optical system for projecting a pattern formed a mask onto an object to be exposed, a correction optical element, provided between the mask and the projection optical system, for reducing a deformation of the pattern, and a detector of an oblique light projection system, provided at a side of a pattern surface of the mask, for detecting a surface shape of the mask through the correction optical element.

The correction optical element may be a correction plate for correcting an offset of the surface shape of the mask from an ideal plane. Alternatively, the correction optical element may be a correction plate for correction optical performance of the projection optical system. The detector may include a correction optical system for correcting optical aberration associated with detections through the correction optical element. The optical aberration may be astigmatism and/or chromatic aberration.

The detector may include a light-irradiating part that includes an illumination optical system for irradiating light onto a mask in an oblique direction through the correction optical element, and the correction optical system, a light-receiving part that includes an imaging optical system that receives, through the correction optical element, light that has been irradiated by the light-irradiating part and reflected on the mask, and the correction optical system, and a photodetector for outputting a detection signal corresponding to a position of the reflected light received by the light-receiving part.

The photodetector may detect the surface shape of the mask at plural measurement points. The exposure apparatus may be a scan-type exposure apparatus, and the plural measurement points may be arranged in a direction orthogonal to a scan direction of the mask.

The correction optical element has such a size as transmits illumination light for illuminating the mask during exposure, and enables entire detection light by said detector to pass through the correction optical element.

The exposure apparatus may be a scan-type exposure apparatus.

The exposure apparatus may be a scan-type exposure apparatus, and scan the correction optical in synchronization with the mask.

A device fabrication method according another aspect of the present invention includes the steps of exposing a pattern on a reticle onto an object by using the above exposure apparatus, and performing a predetermined process for the exposed object. Claims for the device fabrication method that exhibits operations similar to those of the above exposure apparatus cover devices as their intermediate products and finished products. Moreover, such devices include semiconductor chips such as LSIs and VLSIs, CCDs, LCDs, magnetic sensors, thin-film magnetic heads, etc.

Other objects and further features of the present invention will become readily apparent from the following description of the embodiments with reference to accompanying drawings.

DETAILED DESCRIPTION OF THE PREFERRED EMBODIMENTS

A detailed description will be given of the embodiments according to the present invention. While the first embodiment applies the present invention to a scan-type exposure apparatus, the present invention is not limited to the scan type but may provide an exposure apparatus of a full field system with the same effects.

First Embodiment

A description will be given of the first embodiment with reference to FIG. 1.

Figure 1:
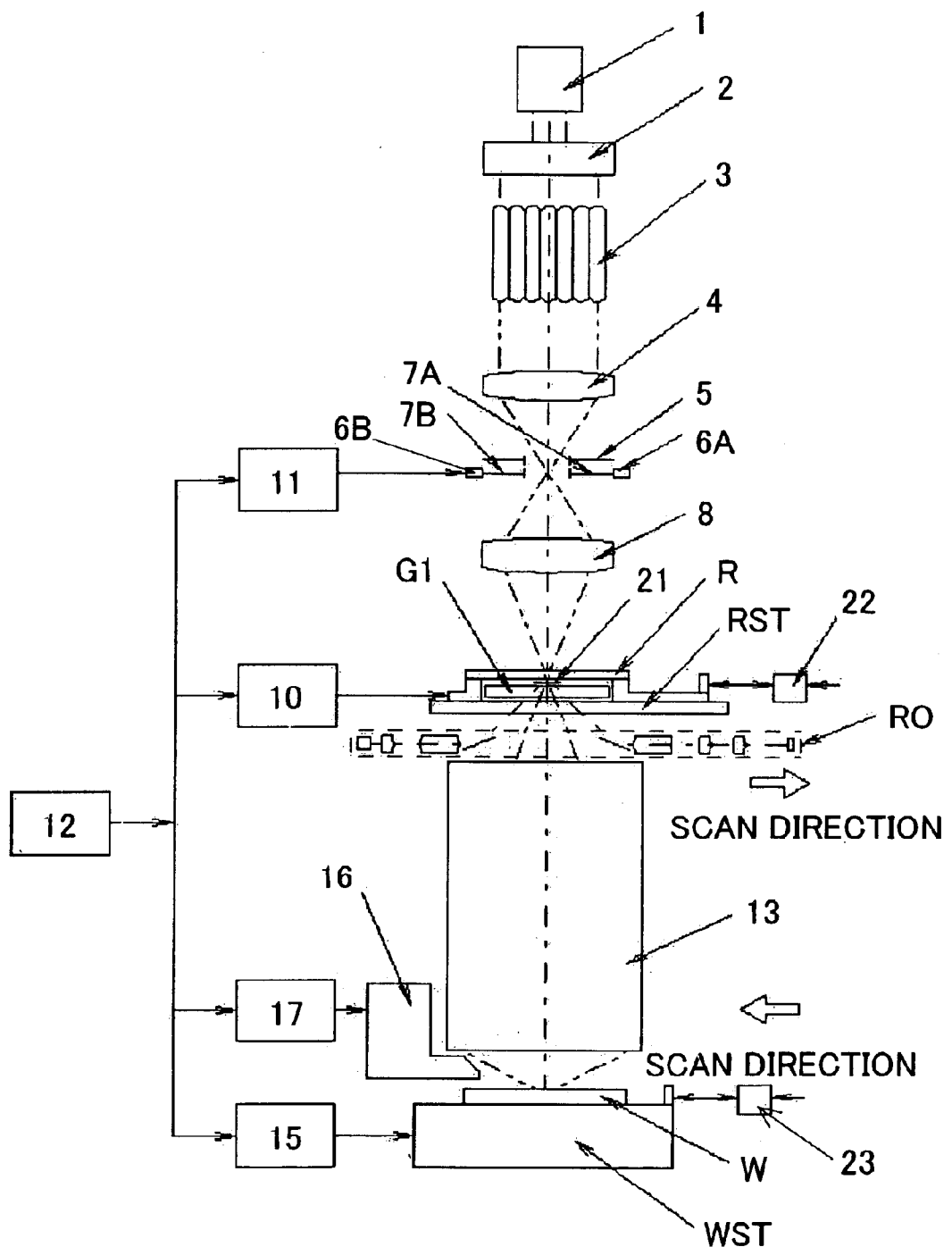
FIG. 1 is a schematic block diagram of an exposure apparatus of a first embodiment according to the present invention.

FIG. 1 shows an overview of a projection exposure apparatus used for this embodiment. In FIG. 1, a rectangular slit-shaped illumination area 21 on a reticle R is illuminated with a uniform light intensity by a light source 1 and an illumination optical system including from an illumination-light shaping optical system 2 to a relay lens 8, and a circuit pattern image on the reticle R in the slit-shaped illumination area 21 is transferred onto the wafer W through a projection optical system 13. The light source 1 may include a pulse light source including an excimer laser light source, such as an $F_2$ excimer laser, ArF excimer laser, and a KrF excimer laser, a metal vapor laser, a harmonic generation device, such as a YAG laser, and a continuous light source, such as a mercury lamp and an ellipsoidal mirror.

The pulse light source switches on and off exposure under control of supply power from a power supply unit for the pulse light source, whereas the continuous light source switches on and off exposure using a shutter in the illumination-light shaping optical system 2. The instant embodiment has a mobile blind or variable field stop 7 as described later, and thus may switch exposure by opening and closing the variable blind 7.

In FIG. 1, a beam diameter of the illumination light from the light source 1 is set to a predetermined size by the illumination-light shaping optical system 2, and the illumination light reaches the fly-eye lens 3. An exit surface of the fly-eye lens 3 forms multiple secondary light sources. The illumination light from these secondary light sources are condensed by the condenser lens 4 and reaches the mobile blind or variable field stop 7 through a fixed field stop 5. Although FIG. 1 arranges the field stop 5 closer to the condenser lens 4 than the mobile blind 7, the field stop 5 may be located at the side of the relay lens system 8.

The field stop 5 forms a rectangular slit-shaped opening, and allows a beam that has passed through the field stop 5 to have a rectangular slit-shaped section, and then enter the relay lens system 8. The longitudinal direction of the slit is a direction perpendicular to the paper. The relay lens system 8 is a lens system that maintains the mobile blind 7 conjugate with the pattern surface on the reticle R. It includes two blades or light shielding plates 7A and 7B that define a width in a scan direction or direction X, which will be described later, and two blades (not shown) that define a width in a non-scan direction perpendicular to the scan direction. The blades 7A and 7B that define the width in the scan direction are supported by drive parts 6A and 6B, respectively, so that they may move in the scan direction independently, whereas two blades (not shown) that define the width in the non-scan direction are also independently movably supported. The instant embodiment irradiates the illumination light only to a desired exposure area defined by the mobile blind 7 in the slit-shaped illumination area 21 on the reticle R, which has been set by the fixed field stop 5. The relay lens system 8 is a bilateral telecentric optical system that maintains telecentricity of the slit-shaped illumination area 21 on the reticle R.

The reticle R is held on a reticle stage RST. An interferometer 22 detects a position of the reticle stage RST, and a reticle-stage drive part 10 drives the reticle stage RST. An optical element G1 is held below the reticle R, and scanned with the reticle R when the reticle stage RST is scan-driven. The circuit pattern image on the reticle R, which is defined by the mobile blind 7 in the slit-shaped illumination area 21, is projected and exposed onto the wafer W through the projection optical system 13.

It is assumed that a direction +X or −X is a scan direction of the reticle R for the slit-shaped illumination area 21 and a direction Z is a direction horizontal to the optical axis of the projection optical system 13 in a two-dimensional plane perpendicular to the optical axis of the projection optical system 13.

In this case, the reticle stage RST is driven by the reticle-stage drive part 10 to scan the reticle R in the scan direction, i.e., direction +X or −X, and a mobile-blind control part 11 controls actions of the drive parts 6A and 6B for the mobile blind 7 and the drive parts for the non-scan direction. A main control system 12 that controls operations of the entire device controls the reticle-stage drive part 10 and the mobile-blind control part 11.

A reticle surface position detection system RO is formed between the optical element G1 held by the reticle stage RST and the projection optical system 13.

The correction optical element G1 corrects distortion in a manner similar to the distortion correction method disclosed in Japanese Laid-Open Patent Application No. 11-045842, and thus a detailed description of the method is omitted.

A wafer W is carried by the wafer feed unit and held on the wafer stage WST, which positions the wafer W in a plane perpendicular to the optical axis of the projection optical system 13, and includes an XY stage that scans the wafer W in the directions ±X, a Z stage that positions the wafer W in the direction Z, etc. An interferometer 23 detects a position of the wafer stage WST. An off-axis alignment sensor 16 is formed above the wafer W. The alignment sensor 16 detects an alignment mark on the wafer W, and a control part 17 processes the detection result, and feeds the processed data to the main control system 12. The main control system 12 controls positioning and scanning of the wafer stage WST through the wafer stage drive part 15.

In exposing a pattern image on the reticle R onto each shot area on the wafer W through the projection optical system 13 in a scan exposure manner, the reticle R is scanned at a speed VR in the direction −X or +X relative to the slit-shaped illumination area 21 that is defined by the field stop 5 in FIG. 1. The wafer W is scanned at a speed VW (=β·VR) in synchronization with scanning of the reticle R in the direction +X (or −X) where β is a projection magnification of the projection optical system 13. Thereby, the circuit pattern image on the reticle R is sequentially transferred on the shot areas on the wafer W.

Figure 2:
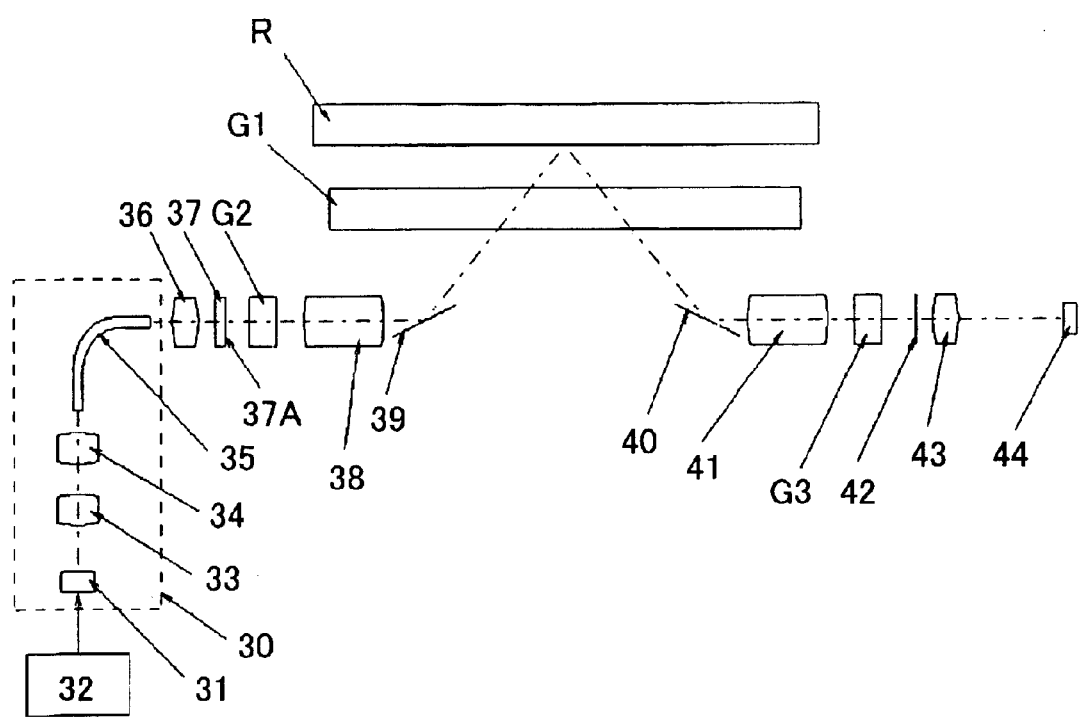
FIG. 2 is a schematic sectional view for explaining a reticle surface position detection system.

Referring now to FIG. 2, a description will be given of the reticle surface position detection system RO. Initially, a description will be given of a basic measurement principal of the reticle surface position detection system. The light is obliquely irradiated onto the reticle pattern surface as a surface to be detected, a position detection element detects an incident position to a predetermined surface of the light that has reflected on the surface to be detected, and the positional information is used to detect the positional information in the direction Z of the surface to be detected (or the optical-axis direction of the projection optical system 13). While FIG. 2 illustrates only one system, plural beams that have been set in the direction approximately orthogonal to the scan direction are projected to plural measurement points on the surface to be detected, and the positional information in the direction Z, which has been obtained at each measurement point is used to calculate inclination information of the surface to be detected. Positional information in the direction Z may be measured in the scan direction from plural measurement points by scanning the reticle R. These pieces of positional information may be used to calculate a surface shape of the pattern surface on the reticle R.

A description will now be given of each element in the reticle surface position detection system. In FIG. 2, 30 is a light source part in the reticle surface position detection system. 31 is a light source in the reticle surface position detection system. 32 is a drive circuit that is adapted to adequately control the intensity of light emitted from the light source 31.

The light emitted from the light source 31 is guided to an optical transmission means 35, such as an optical fiber, through a collimator lens 33 and a condenser lens 34.

The light from the optical transmission means 35 illuminates a slit 37 through an illumination lens 36. The slit 37 forms a surface position measurement mark 37A for the pattern surface on the reticle R, and the mark 37A is projected onto the pattern surface through a correction optical system G2 and the mirror 39 onto a pattern surface of the reticle R as a surface to be detected. An imaging lens 38 maintains the pattern surface on the reticle R optically conjugate with the slit 37. FIG. 2 illustrates a principal ray for description convenience. The light from a mark image that has imaged on the pattern surface on the reticle R is reflected on the pattern surface on the reticle R, and forms a mark image again on a re-imaging position 42 through a mirror 40, a correction optical system G3 and imaging lens 41. The light from the mark image that has re-imaged at the re-imaging position 42 is condensed by an enlargement optical system 43, and approximately forms an image on a light-receiving element 44 for detecting a position. A signal from the light-receiving element 44 is processed by the reticle surface position signal processing system 45 and processed as information on the inclination and the direction Z of the pattern surface on the reticle R as a surface to be detected.

While FIG. 2 illustrates a sectional view and thus only one system, plural systems may be arranged actually. In addition, while FIG. 2 shows a direction of the detection light of the reticle surface position detection system incident on the pattern surface on the reticle R in a direction parallel to the scan direction, the configuration may employ a direction orthogonal to the scan direction or an incidence at an arbitrary angle.

While FIG. 2 arranges the light source at the left side on the paper and the light-receiving element at the right side thereof, they may be arranged reversely.

When this arrangement is applied to FIG. 1, the interferometer 22 is arranged near the light-receiving element 44. Therefore, it is desirable to cover the light-receiving element 44 with an insulator or to provide a heat radiation system or cooling system.

Referring to FIG. 4, a description will be given of a principle of aberrational correction using the correction optical systems G2 and G3. The first correction method inserts a parallel plane plate having approximately the same thickness, inclined angle, and refractive index as those of the correction optical element G1 in the condensed light on a section in the non-measurement direction. The second correction method arranges an optical system that has lenses with power different between sections in the measurement and non-measurement directions, and adjusting the imaging position in the non-measurement section to the imaging position on the measurement section in the optical-axis direction.

Figure 3A:
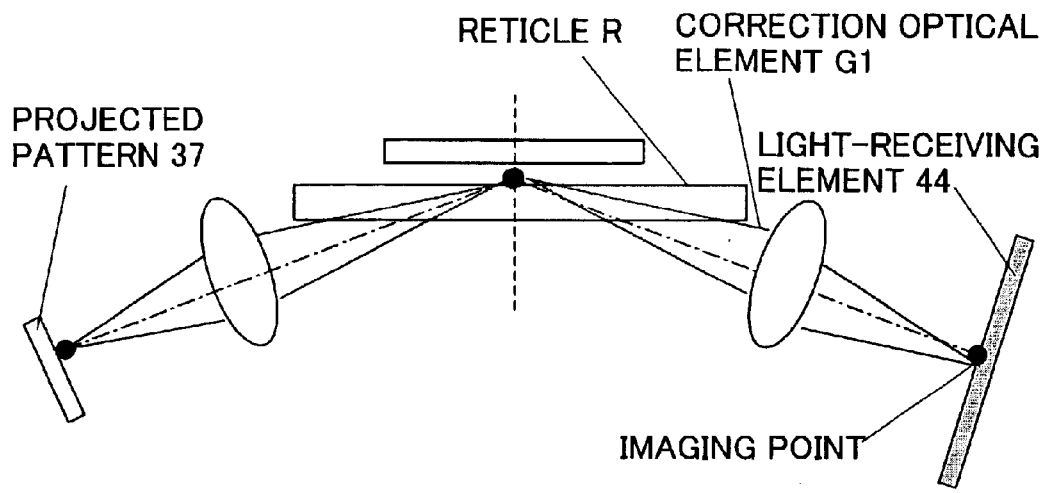
FIG. 3A is a sectional view (or a view showing an imaging condition) in a measurement direction.
Figure 3B:
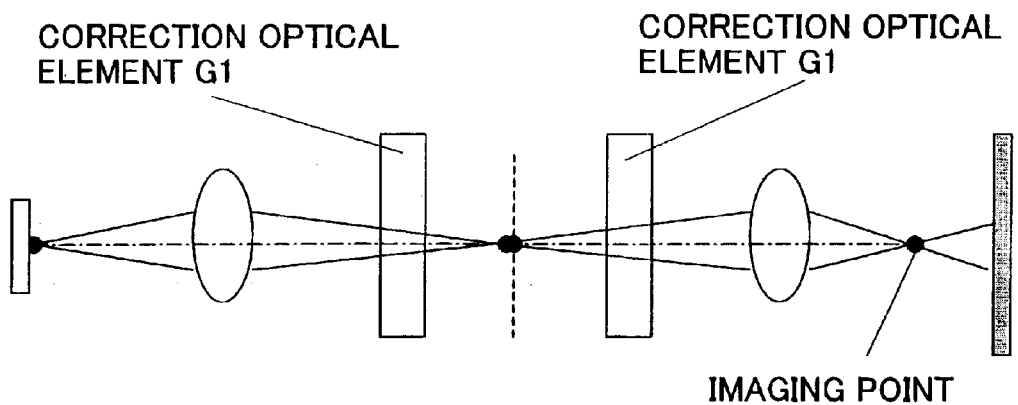
FIG. 3B is a sectional view (or a view showing an imaging condition) in a non-measurement direction.
Figure 4A:
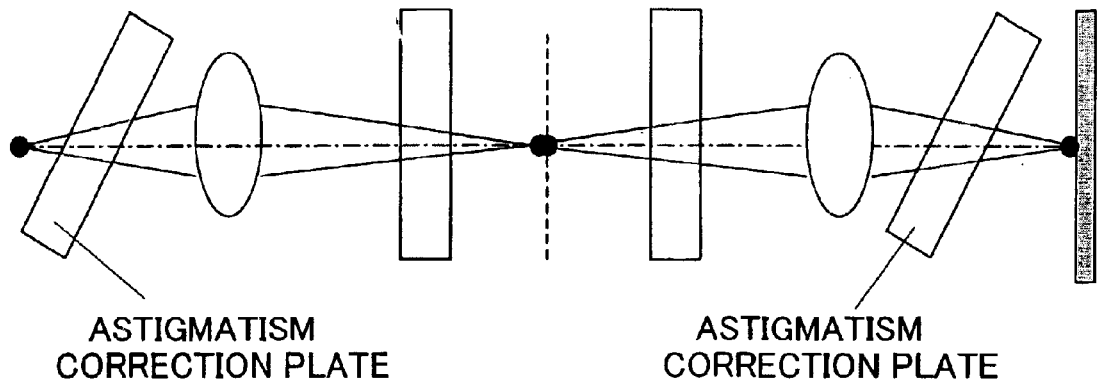
FIGS. 4A and 4B are views for explaining first and second correction principles.

FIG. 4A shows the first correction method. FIG. 4A is a view showing a section in the non-measurement direction corresponding to FIG. 3B. The light-projecting optical system includes the correction optical system G2, and the light-receiving optical system includes the correction optical system G3. The correction optical systems G2 and G3 are inclined by an angle corresponding to an angle between the correction optical element G1 and measurement light. Their thicknesses and refractive indexes are approximately the same as those of the correction optical element G1. Since the correction optical systems G2 and G3 are inclined in the condensed light on a section in the non-measurement direction, the focus position moves in the non-measurement direction. The astigmatism may be corrected since this moving amount approximately accords with the moving amount of the focus position in the measurement direction. While the correction optical systems G2 and G3 have approximately the same thickness as that of the correction optical element G1, the thickness may be varied under design or arrangement restriction. The larger the thickness is, the smaller the inclined angle becomes. The smaller the thickness is, the larger the inclined angle becomes. A correction relies upon a relationship between the thickness and the inclined angle that would make the moving amount of the focus position approximately equal to the amount to be corrected.

Both the light-projecting and light-receiving optical systems include the correction optical elements G2 and G3 in FIG. 4A, but either may include the correction optical elements G2 and G3. In such a case, the moving amount of the focus position that occurs in one of the correction optical systems may be set to be the necessary corrective amount.

Figure 4B:
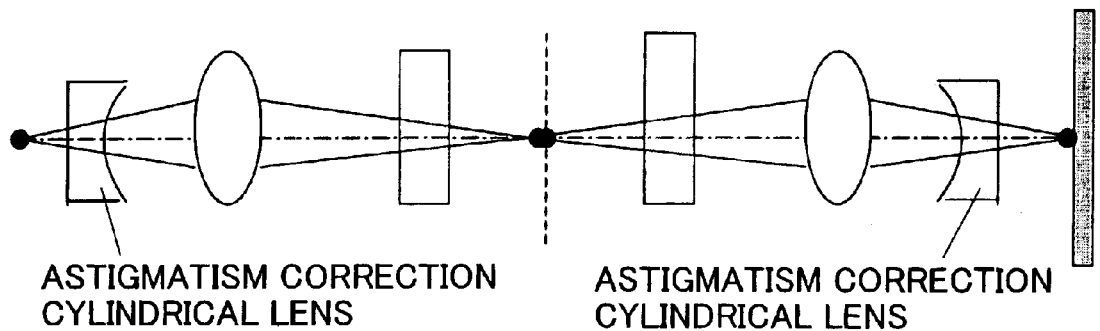

FIG. 4B shows the second correction method, and is different from FIG. 4A in that the correction optical systems G2 and G3 use a cylindrical lens rather than the parallel plane plate. The focus position moves in the non-measurement direction when the correction optical elements or cylindrical lenses G2 and G3 are arranged so that they have power in the non-measurement direction. The radius of curvature of the cylindrical lens is determined so that this moving amount corresponds to the moving amount of the focus position in the measurement direction shown in FIG. 3A. This may correct the astigmatism. The chromatic aberration is corrected by arranging a wedge shaped optical element.

Figure 5A:
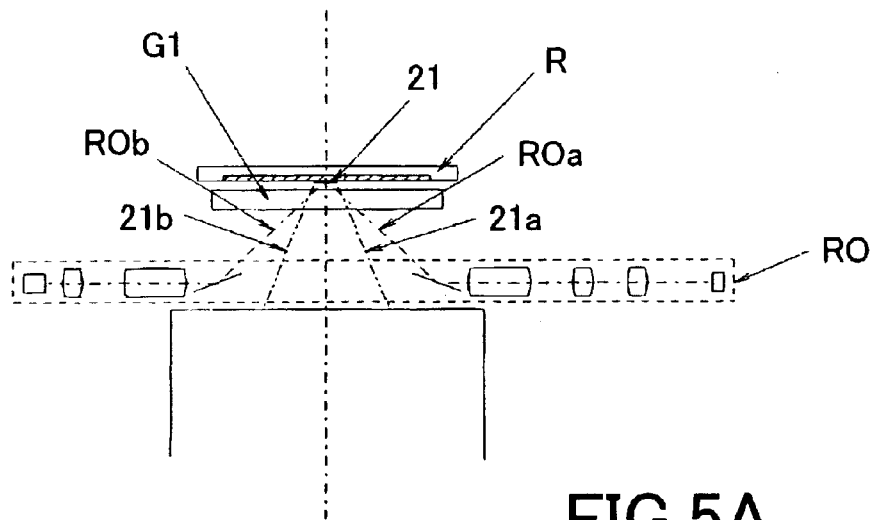
FIGS. 5A–5C are views for explaining a correction optical element along an optical axis, at an end and correction optical element fixing arrangement.

Referring to FIG. 5, a description will be given of the correction optical system G1. FIG. 5A shows that the correction optical system G1 is scanned in synchronization with the reticle R while the reticle R is positioned on the optical axis of the projection optical system 13. The diagonal lines on the reticle R is the pattern part. The illuminated image on the illuminated pattern area within the illumination area 21 is transferred onto the wafer through the projection optical system 13. 21a and 21b show the exposure light directing the projection optical system 13 after illuminating the illumination area 21. ROa and ROb are principal rays of the reticle surface position detection system RO.

Figure 5B:
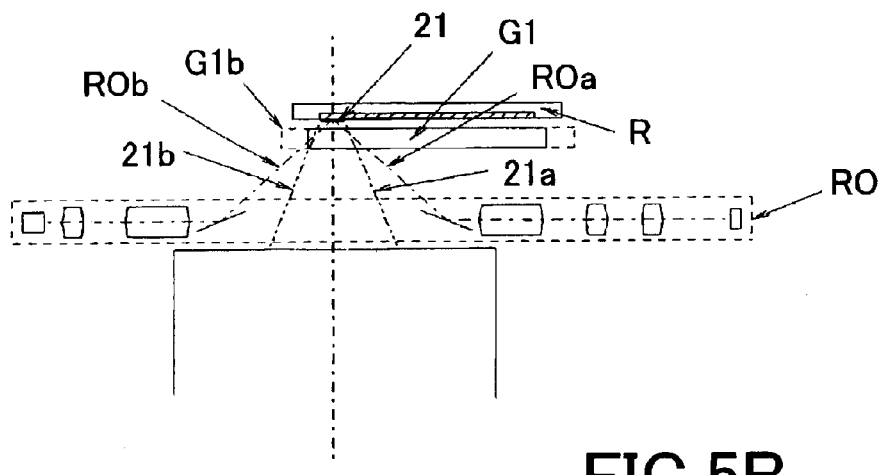

FIG. 5B shows that the reticle R is scanned and moved to the end. In FIG. 5B, the correction optical element G1 is dimensioned as shown by solid lines in order to correct distortion. However, when it is dimensioned as shown by solid lines, part of the principal ray ROb of the reticle surface position detection system RO cannot transmit the correction optical element G1, and thus the pattern surface position of the reticle R cannot be measured. On the other hand, when the correction optical element G1 has a size G1b shown by broken lines, the principal ray ROb of the reticle surface position detection system RO can transmit the correction optical element G1, and thus the pattern surface position of the reticle R can be measured. Although the description about G1a on the opposite side is omitted, it is similar to G1b. While figures other than FIG. 5 show the correction optical element G1 smaller than the reticle R for illustration purposes, a more precise shape is shown in FIG. 5.

A correction method based on the shape of the measured pattern surface on the reticle R is similar to the prior art, and a description thereof will be omitted. The typical correction method corrects a scan direction of the wafer stage, i.e., a position in the height direction or its inclination according to the surface shape. Alternatively, the image surface shape may be corrected to a shape corresponding to the shape of the reticle pattern surface by driving the optical element in the projection optical system 13, or the reticle surface shape itself may be corrected.

Thus, the first embodiment holds the correction optical element G1 on the reticle stage RST, and may arrange the correction optical element G1 near the reticle R. In addition, the reticle surface position detection system RO is arranged by measuring the position of the pattern surface on the reticle R through the correction optical element G1. For precise detections, the correction optical element G1 measures a position of the surface position of the reticle R, and the correction optical systems G2 and G3 may correct aberration that would otherwise occur.

Second Embodiment 2

Figure 6:
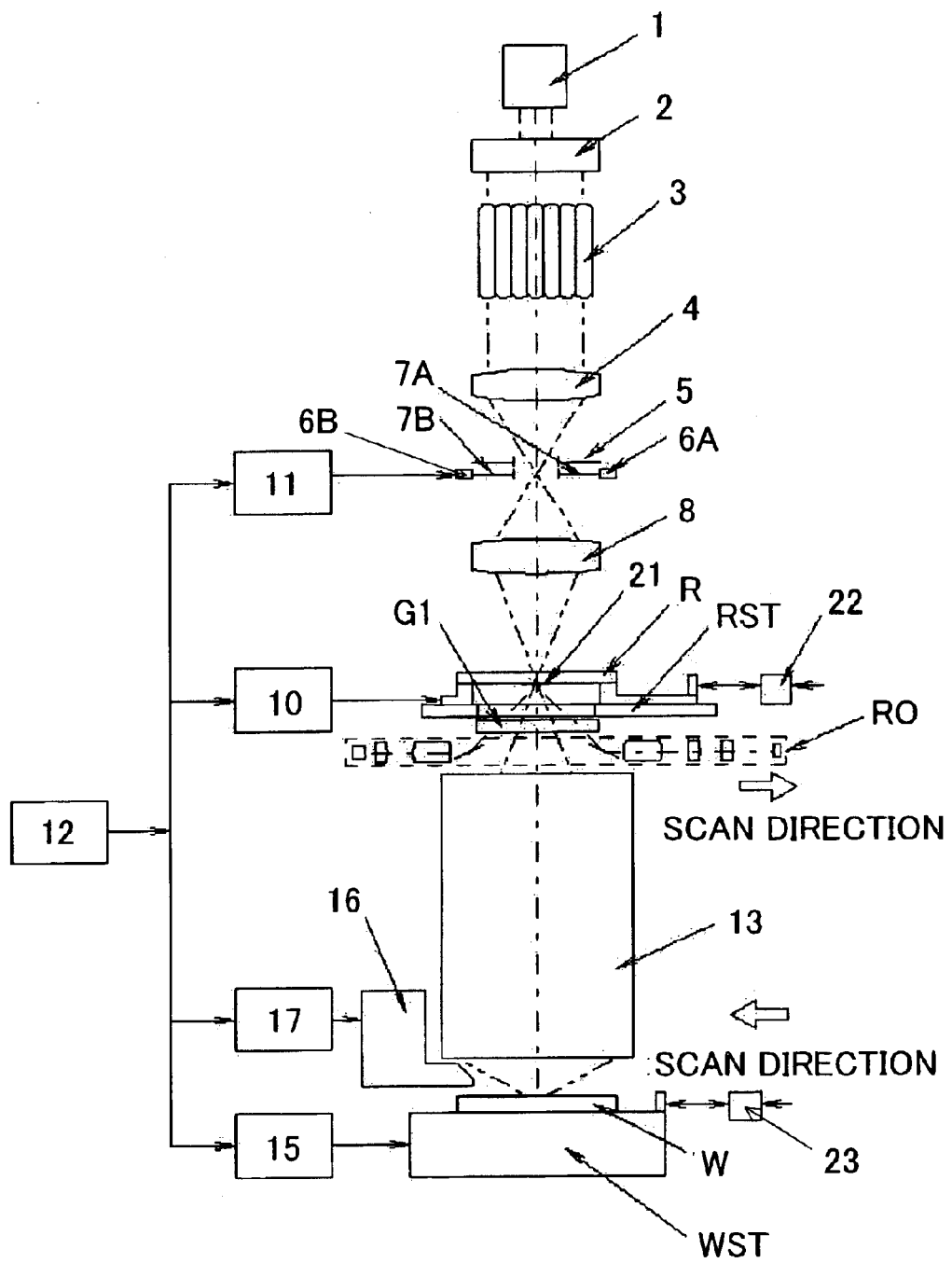
FIG. 6 is a schematic block diagram of an exposure apparatus of a second embodiment according to the present invention.

A description will be given of a second embodiment with reference to FIG. 6. Unlike the first embodiment which holds the correction optical element G1 on the reticle stage RST and scans the correction optical element G1 in synchronization with the reticle R, the second embodiment does not scan the correction optical element G1 but fixes the same on a fixing part. A description will be omitted of those elements in this embodiment which are the same as those in the first embodiment.

This embodiment arranges the correction optical systems G2 and G3 and uses the correction principle similar to the first embodiment.

The second embodiment does not scan the correction optical element G1 in synchronization with the reticle R, and thus the correction optical element G1 has such a size that the exposure light that illuminates the area in the illumination area 21 may transmit through the correction optical element G1.

Not scanning the correction optical element G1 in synchronization with the reticle R, the second embodiment cannot disadvantageously correct the distortion caused by the surface shape of the reticle R while the reticle R is absorbed on the reticle stage RST. In addition, arranging the correction optical element G1 more distant from the reticle R than that of the first embodiment so as to avoid interference between the correction optical element G1 and a mobile part of the reticle stage RST, the second embodiment has a disadvantageously lowered precision in correcting the distortion.

Nevertheless, the mobile part of the reticle stage RST does not have to be mounted with the correction optical element G1, and advantageously the mobile part may be made lightweight and easily controllable.

Even in a configuration that does not scan the correction optical element G1 in synchronization with the reticle R, the reticle surface position detection system RO may detect the pattern surface on the reticle R through the correction optical element G1.

Figure 5C:
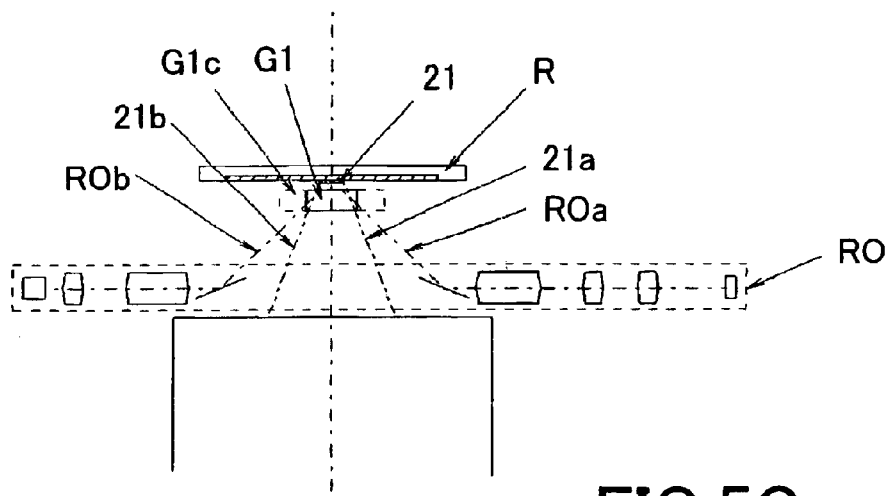

A description will be given of the correction optical element G1 in the second embodiment. FIG. 5C shows that the reticle R is located on the optical axis of the projection optical system 13. The illuminated image on the illuminated pattern area within the illumination area 21 is transferred onto the wafer through the projection optical system 13. 21a and 21b show the exposure light directing the projection optical system 13 after illuminating the illumination area 21. ROa and ROb are principal rays of the reticle surface position detection system RO.

In FIG. 5C, the correction optical element G1 is not scanned while the reticle R is scanned, and therefore the correction optical element G1 may be dimensioned as shown by solid lines in order to correct distortion. However, when it is dimensioned as shown by solid lines, part of the principal ray ROb of the reticle surface position detection system RO cannot transmit through the correction optical element G1, and thus the pattern surface position of the reticle R cannot be measured. On the other hand, when the correction optical element G1 has a size G1c shown by broken lines, the principal ray ROb of the reticle surface position detection system RO can transmit through the correction optical element G1, and thus the pattern surface position of the reticle R can be measured.

Thus, even in the second embodiment, the reticle surface position detection system RO is arranged by measuring the position of the pattern surface on the reticle R through the correction optical element G1. For precise detections, the correction optical element G1 measures a position of the surface position of the reticle R, and the correction optical systems G2 and G3 may correct aberration that would otherwise occur.

According to the present invention, the reticle surface position detection system of an oblique light projection system detects a difference between the deformation amounts between surface shapes of the reticles generated when the reticle thermally deforms during the exposure or when the reticle is replaced, absorbed and fixed. The correction amount is operated based on this detection result, and a correction is executed. Advantageously, a correction of the distortion, etc. resulting from the reticle's pattern surface shape would restrain the curvature of the pattern image, and stably provide a precise image of a reticle pattern.

In addition, the correction optical element corrects distortion that results from a deformation of the reticle due to the reticle's own weight and a combination between a surface shape of the absorption part for absorbing the reticle and a surface shape of the reticle, and distortion that would otherwise occur as a manufacture adjustment residual error of the projection optical system, restrains the curvature of the pattern image, and stably provides a precise image of a reticle pattern.

Figure 7:
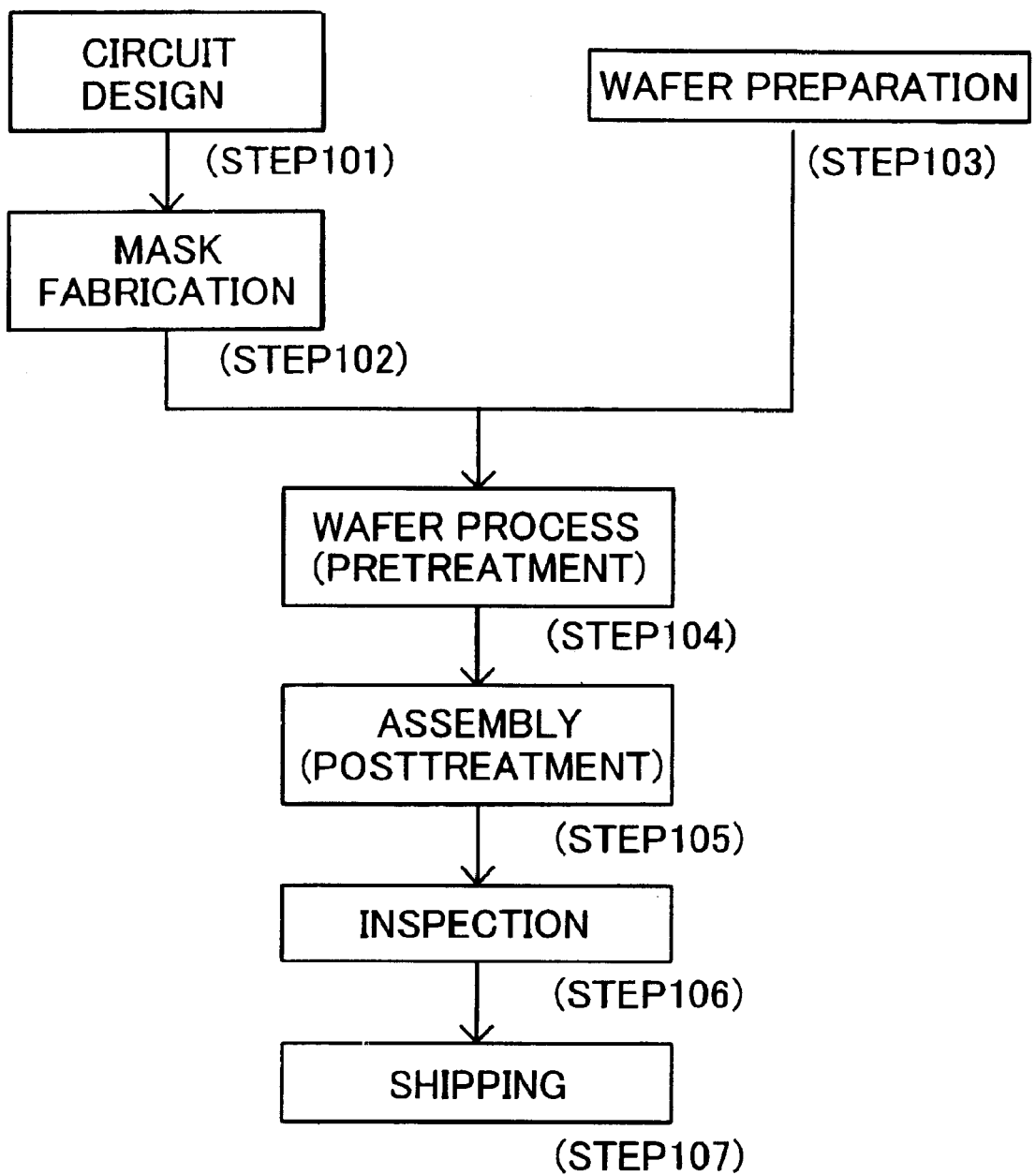
FIG. 7 is a flowchart of an inventive semiconductor device manufacturing method.
Figure 8:
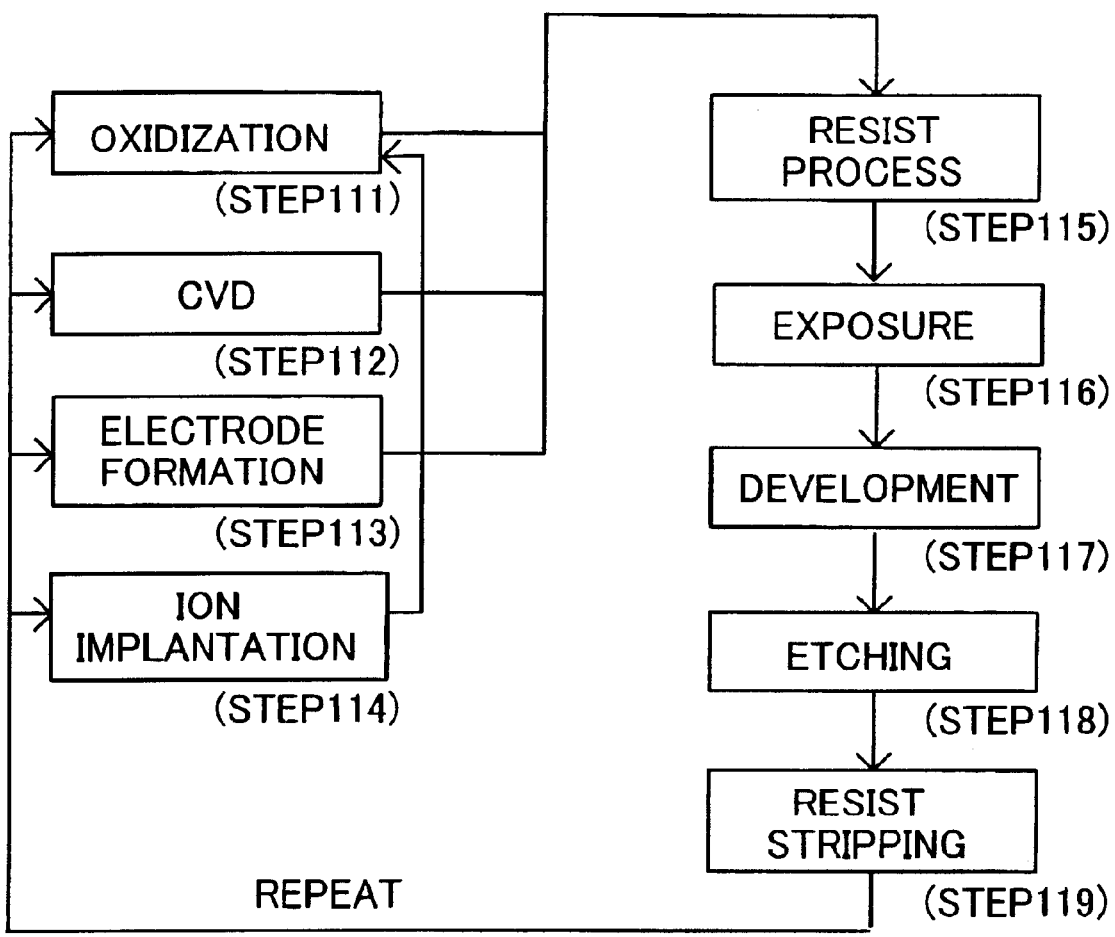
FIG. 8 is a flowchart of an inventive semiconductor device manufacturing method.

Referring now to FIGS. 7 and 8, a description will be given of an embodiment of a device fabrication method using the above mentioned exposure apparatus. FIG. 7 is a flowchart for explaining the way of fabricating devices (i.e., semiconductor chips such as IC and LSI, LCDs, CCDs, and the like). A description will now be given of the fabrication of a semiconductor chip as an example. Step 101 (circuit design) designs a device circuit. Step 102 (mask fabrication) forms a mask having a designed circuit pattern. Step 103 (wafer making) manufactures a wafer using materials such as silicon. Step 104 (wafer process), which is also referred to as a pretreatment, forms actual circuitry on the wafer through lithography using the mask and wafer. Step 105 (assembly), which is also referred to as a post-treatment, forms into a semiconductor chip the wafer formed in Step 104 and includes an assembly step (e.g., dicing, bonding), a packaging step (chip sealing), and the like. Step 106 (inspection) performs various inspections for the semiconductor device made in Step 105, such as a validity test and a durability test. Through these steps, a semiconductor device is finished and shipped (Step 107).

FIG. 8 is a detailed flowchart of the wafer process in Step 104. Step 111 (oxidation) oxidizes the wafer's surface. Step 112 (CVD) forms an insulating film on the wafer's surface. Step 113 (electrode formation) forms electrodes on the wafer by vapor disposition and the like. Step 114 (ion implantation) implants ion into the wafer. Step 115 (resist process) applies a photosensitive material onto the wafer. Step 116 (exposure) uses the exposure apparatus to expose a circuit pattern on the mask onto the wafer. Step 117 (development) develops the exposed wafer. Step 118 (etching) etches parts other than a developed resist image. Step 119 (resist stripping) removes disused resist after etching. These steps are repeated, and multi-layer circuit patterns are formed on the wafer. Use of the fabrication method in this embodiment helps fabricate higher-quality devices than ever.

Further, the present invention is not limited to these preferred embodiments and various variations and modifications may be made without departing from the scope of the present invention.

Thus, the present invention provides an exposure apparatus for projecting a mask pattern properly by precisely detecting a mask's deformation while preventing the apparatus from being larger.

What is claimed is:

1. An exposure apparatus comprising:
   a projection optical system for projecting a pattern formed a mask onto an object to be exposed;
   a correction optical element, provided between the mask and said projection optical system, for reducing a deformation of the pattern; and
   a detector of an oblique light projection system, provided at a side of a pattern surface of the mask, for detecting a surface shape of the mask through said correction optical element.

2. An exposure apparatus according to claim 1, wherein said correction optical element is a correction plate for correcting an offset of the surface shape of the mask from an ideal plane.

3. An exposure apparatus according to claim 1, wherein the correction optical element is a correction plate for correction optical performance of said projection optical system.

4. An exposure apparatus according to claim 1, wherein said detector includes a correction optical system for correcting optical aberration associated with detections through said correction optical element.

5. An exposure apparatus according to claim 4, the optical aberration is astigmatism and/or chromatic aberration.

6. An exposure apparatus according to claim 4, wherein said detector includes:
   a light-irradiating part that includes the correction optical system and an illumination optical system for irradiating light onto a mask in an oblique direction through the correction optical element;
   a light-receiving part that includes the correction optical system and an imaging optical system that receives, through the correction optical element, light that has been irradiated by said light-irradiating part and reflected on the mask; and
   a photodetector for outputting a detection signal representative of a position of the reflected light received by the light-receiving part.

7. An exposure apparatus according to claim 1, wherein said photodetector detects the surface shape of the mask at plural measurement points.

8. An exposure apparatus according to claim 7, wherein the exposure apparatus is a scan-type exposure apparatus, and said plural measurement points are arranged in a direction orthogonal to a scan direction of the mask.

9. An exposure apparatus according to claim 1, wherein said correction optical element has such a size as transmits illumination light for illuminating the mask during exposure, and enables entire detection light by said detector to pass through said correction optical element.

10. An exposure apparatus according to claim 1, wherein said exposure apparatus is a scan-type exposure apparatus.

11. An exposure apparatus according to claim 1, wherein said exposure apparatus is a scan-type exposure apparatus, and scans said correction optical in synchronization with the mask.

12. A device fabrication method comprising the steps of:
   exposing a pattern on a reticle onto an object by using an exposure apparatus; and
   performing a predetermined process for the exposed object,
   wherein the exposure apparatus includes:
      a projection optical system for projecting a pattern formed a mask onto an object to be exposed;
      a correction optical element, provided between the mask and said projection optical system, for reducing a deformation of the pattern; and
      a detector of an oblique light projection system, provided at a side of a pattern surface of the mask, for detecting a surface shape of the mask through said correction optical element.

* * * * *

UNITED STATES PATENT AND TRADEMARK OFFICE
CERTIFICATE OF CORRECTION

PATENT NO. : 6,738,128 B2
DATED : May 18, 2004
INVENTOR(S) : Shinichi Shima et al.

It is certified that error appears in the above-identified patent and that said Letters Patent is hereby corrected as shown below:

Title page,
Item [57], ABSTRACT,
Line 2, "formed" should read -- formed on --.

Drawings,
Sheet 7, FIG. 7, in "(STEP 105)," "POSTTREATMENT" should read -- POST TREATMENT --.

Column 1,
Line 37, "attentions," should read -- attention, --.
Line 48, "affected" should read -- being affected --.

Column 6,
Line 8, "formed a" should read -- formed on a --.
Line 49, "according" should read -- according to --.

Column 13,
Line 7, "above mentioned" should read -- above-mentioned --.
Line 51, "formed" should read -- formed on --.

Column 14,
Line 54, "formed a" should read -- formed on a --.

Signed and Sealed this

First Day of February, 2005

JON W. DUDAS
*Director of the United States Patent and Trademark Office*